United States Patent [19]

Okazaki

[11] Patent Number: 5,949,804
[45] Date of Patent: Sep. 7, 1999

[54] SEMICONDUCTOR LIGHT EMISSION DEVICE

[75] Inventor: Yoji Okazaki, Kanagawa-ken, Japan

[73] Assignee: Fuji Photo Film Co., Ltd., Kanagawa-ken, Japan

[21] Appl. No.: 08/993,708

[22] Filed: Dec. 18, 1997

[30] Foreign Application Priority Data

Dec. 25, 1996 [JP] Japan .................................... 8-345208

[51] Int. Cl.⁶ .................................................... H01S 3/13
[52] U.S. Cl. ................................ 372/32; 372/20; 372/49; 372/98; 372/99
[58] Field of Search .................................. 372/20, 92, 98, 372/99, 105, 49, 32, 29

[56] References Cited

U.S. PATENT DOCUMENTS 5,559,816  9/1996  Basting et al. ............................ 372/27
5,608,743  3/1997  Hayakawa ................................. 372/20
5,809,048  9/1998  Shichijyo et al. ........................ 372/32

OTHER PUBLICATIONS

"1W, CW, Diffraction–Limited, Tunable External–Cavity Semiconductor Laser", D. Mehuys et al., Electronics Letters, vol. 29, No. 14, pp. 1254–1255, Jul. 1993.

Primary Examiner—James W. Davie
Attorney, Agent, or Firm—Sughrue, Mion, Zinn, Macpeak & Seas, PLLC

[57] ABSTRACT

A semiconductor light emission device includes a semiconductor light amplifier, a mirror which reflects light emanating from an end face of the semiconductor light amplifier to return to the end face of the semiconductor light amplifier and a wavelength selector which is inserted into the optical path of the light. The wavelength selector is a Lyot filter, an etalon or a combination of a Lyot filter and an etalon.

16 Claims, 6 Drawing Sheets

PRIOR ART

SEMICONDUCTOR LIGHT EMISSION DEVICE

BACKGROUND OF THE INVENTION

1. Field of the Invention

This invention relates to a semiconductor light emission device, and more particularly to a semiconductor light emission device which has a semiconductor light amplifier as a light source and in which light emanating from the semiconductor light amplifier is selected by wavelength and only a selected wavelength is returned to the semiconductor light amplifier, thereby controlling the wavelength of light emitted from the semiconductor light emission device.

2. Description of the Related Art

There have been made various attempts to obtain a high output light beam of a single wavelength by use of a semiconductor. An example of such a semiconductor light emission device is disclosed in "ELECTRONICS LETTERS", vol. 29, No. 14, (1993) pp. 1254 to 1255.

The semiconductor light emission device has a semiconductor light amplifier 1 as a light source as shown in FIG. 11. Light emanating from the rear end face 1a of the semiconductor light amplifier 1 is collimated by a lens 2 and reflected by a reflecting diffraction grating 3 to return to the semiconductor light amplifier 1. With this arrangement, light 4 having a wavelength selected by the diffraction grating 3 is returned to the semiconductor light amplifier 1 and accordingly the wavelength of light 4F emitted through the front end face 1b of the semiconductor light amplifier 1 is locked to a single wavelength, whereby a light beam of high quality and high output (not lower than 1 W) close to a diffraction limit can be obtained.

This applicant has disclosed a semiconductor light emission device in which the wavelength of emission light is selected by a band pass filter in place of the aforesaid diffraction grating, thereby increasing the degree of freedom in selecting the semiconductor light amplifier, reducing the manufacturing cost and facilitating adjustment. See U.S. Pat. No. 5,608,743. As shown in FIG. 12, the semiconductor light emission device comprises a semiconductor light amplifier 1, a mirror 5 which reflects light 4 emanating from the rear end face 1a of the semiconductor light amplifier 1 to return to the rear end face 1a and a narrow band pass filter 6 inserted into the optical path of the light 4.

Though the semiconductor light emission device using such a band pass filter can accomplish the objects, it is disadvantageous in that the threshold current for oscillation is high and the light emission efficiency is low.

SUMMARY OF THE INVENTION

In view of the foregoing observations and description, the primary object of the present invention is to lower the threshold current for oscillation and increase the light emission efficiency in a semiconductor light emission device in which light emanating from a semiconductor light amplifier is reflected by a mirror to return to the semiconductor light amplifier, thereby locking the wavelength of light emitted from the semiconductor light emission device to a single wavelength.

A semiconductor light emission device in accordance with a first aspect of the present invention comprises a semiconductor light amplifier, a mirror which reflects light emanating from the semiconductor light amplifier to return to the semiconductor light amplifier and a wavelength selector which is inserted into the optical path of the light and is characterized in that the wavelength selector is a Lyot filter.

A semiconductor light emission device in accordance with a second aspect of the present invention comprises a semiconductor light amplifier, a mirror which reflects light emanating from the semiconductor light amplifier to return to the semiconductor light amplifier and a wavelength selector which is inserted into the optical path of the light and is characterized in that the wavelength selector is an etalon.

A semiconductor light emission device in accordance with a third aspect of the present invention comprises a semiconductor light amplifier, a mirror which reflects light emanating from the semiconductor light amplifier to return to the semiconductor light amplifier and a wavelength selector which is inserted into the optical path of the light and is characterized in that the wavelength selector is formed of a Lyot filter and an etalon.

It is preferred that the mirror is a dielectric multilayer mirror which is narrow in the reflection wavelength band.

Investigation of this inventor has revealed that the aforesaid problems inherent to the conventional semiconductor light emission devices using a band pass filter are due to a large loss because of a low transmittance of the band pass filter, about 36% for one reciprocation.

To the contrast, the transmittance of the Lyot filter or the etalon is generally as high as about 99% for one reciprocation. Accordingly, by using a Lyot filter or an etalon as the wavelength selector, loss can be suppressed, whereby the threshold current for oscillation is lowered and the light emission efficiency is increased.

Further when a dielectric multilayer mirror which is narrow in the reflection wavelength band is used as the mirror, a sharper wavelength selection can be obtained coupled with the use of the Lyot filter and/or the etalon, whereby the light emission wavelength width can be very narrow.

DESCRIPTION OF THE PREFERRED EMBODIMENTS

Figure 1:
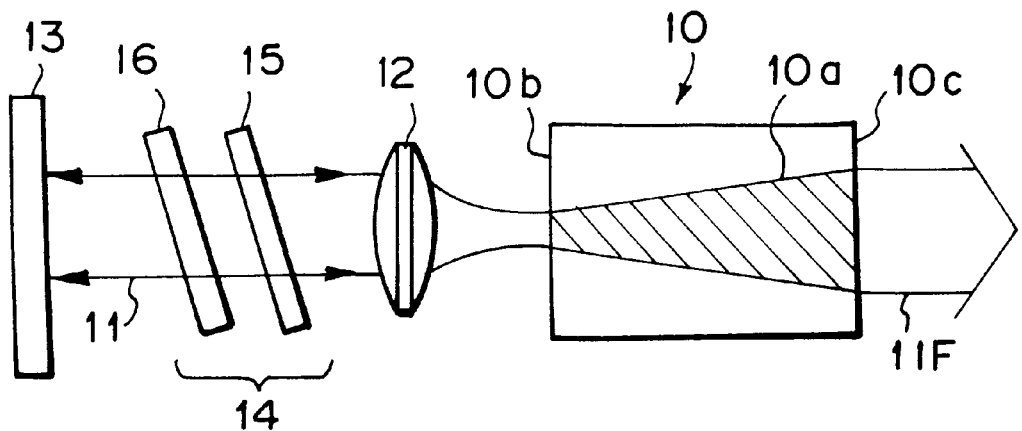
FIG. 1 is a schematic plan view of a semiconductor light emission device in accordance with a first embodiment of the present invention.

In FIG. 1, a semiconductor light emission device in accordance with a first embodiment of the present invention comprises a semiconductor light amplifier 10 having a tapered stripe 10a, a collimator lens 12 which collimates a light beam 11 emanating from the rear end face 10b of the semiconductor light amplifier 10, a mirror 13 which reflects the collimated light beam 11 to return along its optical path to the mirror 13 and a Lyot filter 14.

Figure 2:
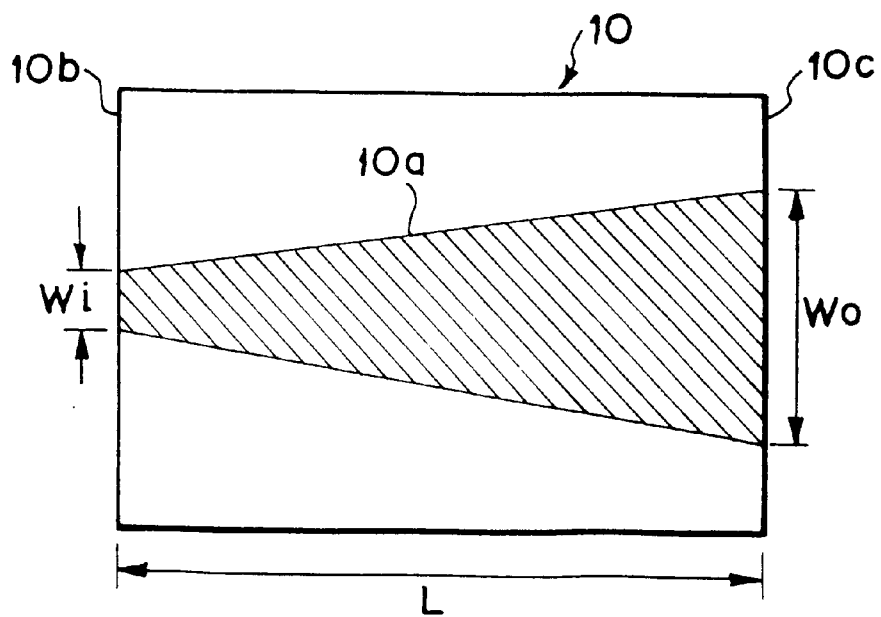
FIG. 2 is an enlarged plan view of the semiconductor light amplifier employed in the first embodiment.

As shown in FIG. 2, the semiconductor light amplifier 10 is 4 $\mu$m in the width Wi at the rear end face 10b, 360 $\mu$m in the width Wo of the tapered stripe 10a at the front end face 10c and 1.5 mm in length L of the tapered stripe 10a. In this particular embodiment, the semiconductor light amplifier 10 comprises an n-GaAs buffer layer (doped with $1 \times 10^{18}$ cm$^{-3}$ of Si, 0.5 $\mu$m in thickness), an n-Al$_{0.5}$Ga$_{0.5}$As clad layer (doped with $1 \times 10^{18}$ cm$^{-3}$ of Si, 2.5 $\mu$m in thickness), an n-Al$_{0.25}$Ga$_{0.75}$As light guide layer (undoped, 0.05 $\mu$m in thickness), an n-Al$_{0.05}$Ga$_{0.95}$As quantum well layer (undoped, 8 nm in thickness), an n-Al$_{0.25}$Ga$_{0.75}$As light guide layer (undoped, 0.05 $\mu$m in thickness), a p-Al$_{0.5}$Ga$_{0.5}$As clad layer (doped with $1 \times 10^{18}$ cm$^{-3}$ of Zn, 2 $\mu$m in thickness) and a p-GaAs capping layer (doped with $5 \times 10^{18}$ cm$^{-3}$ of Zn, 0.3 $\mu$m in thickness) formed on an n-GaAs substrate (doped with $2 \times 10^{18}$ cm$^{-3}$ of Si) by a vacuum MOCVD.

The tapered stripe 10a may be formed, for instance, by forming a SiO$_2$ film over the capping layer by a plasma CVD method, removing the SiO$_2$ film in the area in which the tapered stripe 10a is to be formed by a photolithography and etching and forming ohmic electrodes respectively of AuZn/Au and AuGe/Ni/Au on the p-side and n-side.

The end faces 10b and 10c of the semiconductor light amplifier 10 are provided with a low reflectivity coating whose reflectivity as seen from inside the semiconductor light amplifier 10 is not higher than 0.5%, so that the semiconductor light amplifier 10 is so-called a travelling-wave amplifier.

The Lyot filter 14 is formed by a pair of birefringent elements 15 and 16 which are inclined at Brewster angle to the optical axis. Each of the birefringent elements 15 and 16 is formed by cutting a un-doped YVO$_4$ crystal (a birefringent material) into a plane parallel plate and polishing the plane parallel plate. The birefringent elements 15 and 16 are 0.5 mm and 1.0 mm in thickness, respectively.

In the arrangement described above, the light beam 11 emanating from the rear end face 10b of the semiconductor light amplifier 10 includes components having wavelengths of 800 to 820 nm. However only the components having a certain wavelength (about 0.1 nm in full width at half maximum) in the wavelength band of 800 to 820 nm return to the semiconductor light amplifier 10 reflected by the mirror 13 due to wavelength selection by the Lyot filter 14. Thus the emission wavelength of the semiconductor light emission device is controlled to said certain wavelength. The light 11F of the wavelength is amplified while travelling forward (rightward as seen in FIG. 1) in the semiconductor light amplifier 10 and emitted through the front end face 10c of the semiconductor light amplifier 10.

The wavelength selection by the Lyot filter 14 will be described, hereinbelow. Each of the birefringent elements 15 and 16 forms a $\lambda/2$ plate to said certain wavelength (e.g., 810 nm). The transmittance of the P-polarized components of the light beam 11 at the interface of air and the birefringent element 15 (16) at Brewster angle to the optical axis is 100% (for each interface). To the contrast, the transmittances of the polarized components of the light beam 11 are lower and in the case of the S-polarized components, the transmittance is about 30%.

While the light beam 11 once travels back and forth through the Lyot filter 14, the light beam 11 impinges upon the interface of air and the birefringent element (15 or 16) eight times. The light components of 810 nm which impinge upon the first interface in a P-polarized state are kept in the P-polarized state. Accordingly the transmittance of the P-polarized components for one round trip through the Lyot filter 14 is close to 100%, e.g., 99%. To the contrast, the direction of linear polarization of the light components having wavelengths other than 810 nm is rotated each time the components pass through the birefringent element 15 or 16 and accordingly such components are reflected and cut at each interface. Accordingly, by causing linearly polarized light to impinge upon the Lyot filter 14 in a P-polarized state and pass through the Lyot filter 14 back and forth, a single longitudinal mode can be obtained.

Figure 3:
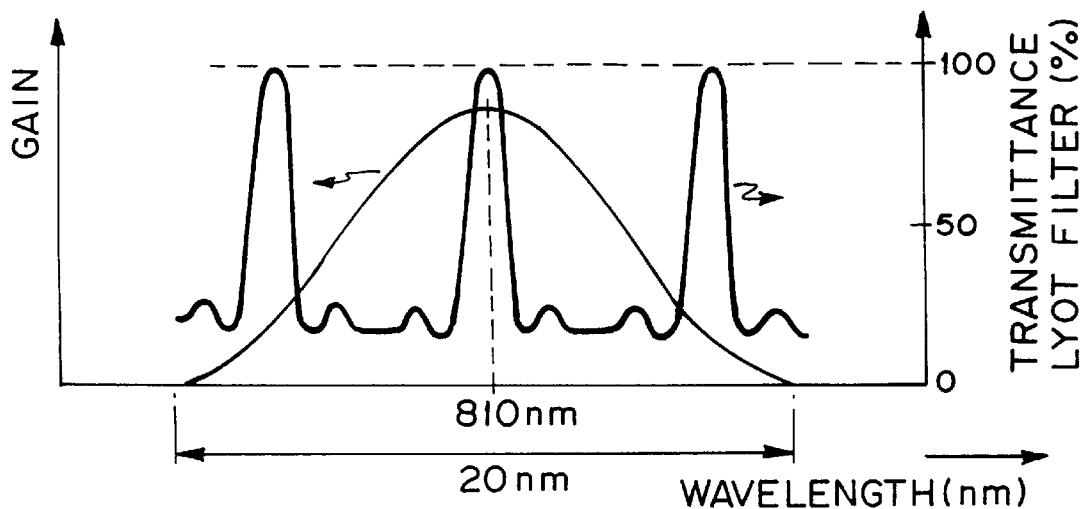
FIG. 3 is a graph showing the gain properties of the semiconductor light amplifier and the transmission spectrum of the Lyot filter in the semiconductor light emission device of the first embodiment.
Figure 4:
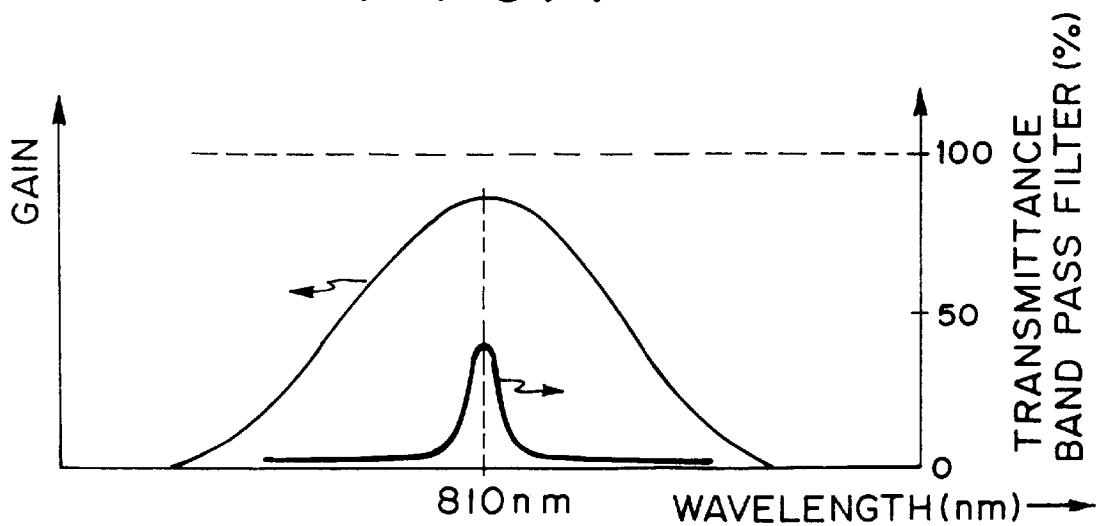
FIG. 4 is a graph showing the gain properties of the semiconductor light amplifier and the transmission spectrum of the band pass filter in the conventional semiconductor light emission device.

In the AlGaAs semiconductor light amplifier 10 employed in this embodiment, the full width of gain is about 20 nm as shown in FIG. 3 and accordingly the free spectral range of the Lyot filter 14 may be about a half of the full width of gain, i.e., about 10 nm. As shown further in FIG. 3, the transmittance of the light of 810 nm at the Lyot filter 14 is very high, about 99%. Accordingly the semiconductor light emission device of the first embodiment, loss is very small, whereby the threshold current can be reduced, the light emission efficiency can be improved and a high output light beam 11F can be obtained.

To the contrast, in the conventional semiconductor light emission device employing a band pass filter, the transmittance at the band pass filter is low (36% for one round trip) and accordingly loss is large, which makes it difficult to obtain a high output light beam.

Though, in the first embodiment, a Lyot filter 14 comprises a pair of birefringent elements which at Brewster angle to the optical axis, a Lyot filter comprising a birefringent element and a polarizer may also be employed.

Figure 5:
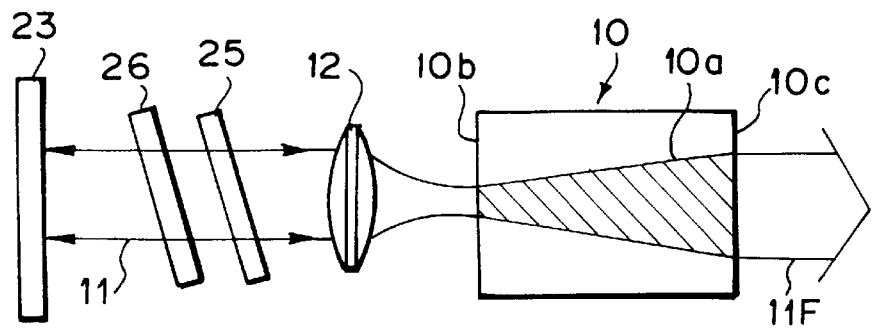
FIG. 5 is a schematic plan view of a semiconductor light emission device in accordance with a second embodiment of the present invention.

A semiconductor light emission device in accordance with a second embodiment of the present invention will be described with reference to FIG. 5, hereinbelow. In FIG. 5, the elements analogous to those shown in FIG. 1 are given the same reference numerals and will not be described here.

Figure 6:
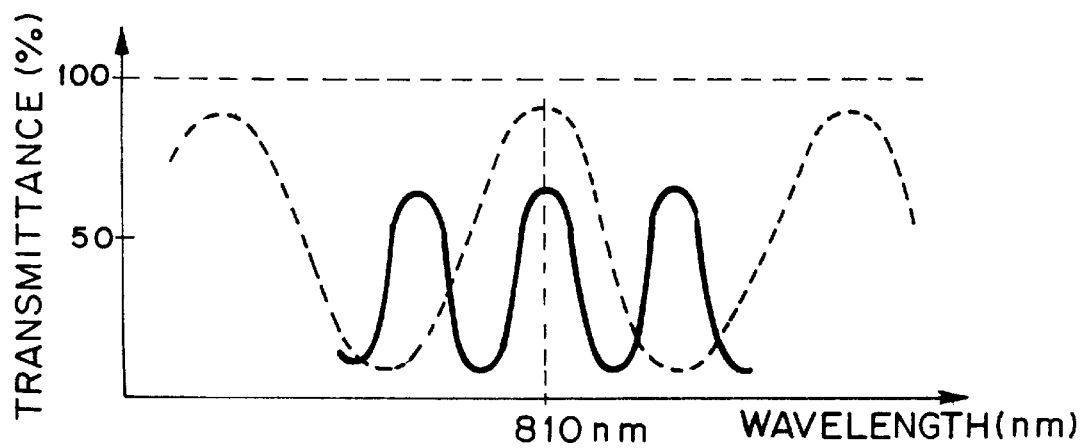
FIG. 6 is a graph showing the transmission spectrum of the etalon employed in the second embodiment.

In the second embodiment, a pair of etalons 25 and 26 formed of quartz plates are employed as a wavelength selector in place of the Lyot filter 14. The front etalon 25 is 40 $\mu$m thick and has a reflectivity of 10% to a wavelength of 810 nm and the rear etalon 26 is 200 $\mu$m thick and has a reflectivity of 35% to a wavelength of 810 nm. The transmission spectra of the front and rear etalons 25 and 26 are shown respectively by the dashed line and the solid line in FIG. 6. The combined spectrum of the etalons 25 and 26 becomes sharper than that of either one of the etalons and accordingly by providing two etalons, the wavelength selection can be sharper.

Figure 7:
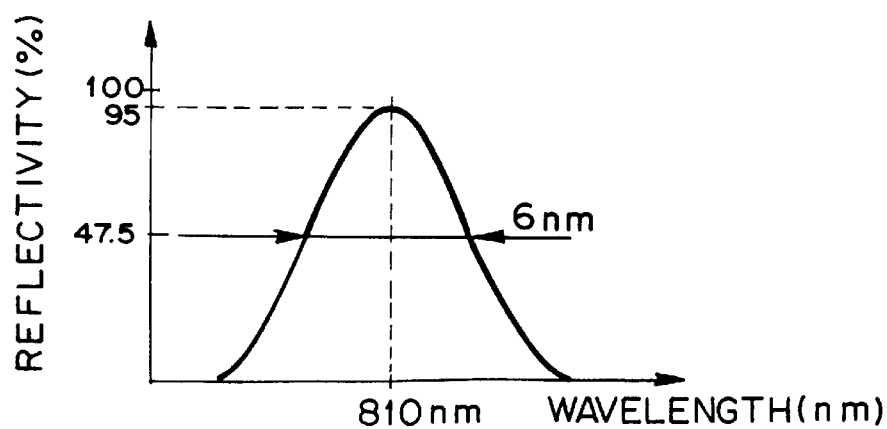
FIG. 7 is a graph showing the reflection spectrum of the dielectric multilayer mirror employed in the second embodiment.

In the second embodiment, a mirror 23 for reflecting the light beam 11 is a dielectric multilayer mirror having a dielectric multilayer formed on an optical glass. The reflection spectrum of the mirror 23 is shown in FIG. 7. The reflection wavelength width (full width at half maximum) of the dielectric multilayer mirror 23 is 6nm and accordingly the full width of gain of the semiconductor light amplifier 10, which is originally about 20 nm, becomes apparently 6nm when the light beam 11 is reflected by the dielectric multilayer mirror 23, whereby the combined free spectral range of the etalons 25 and 26 can be about 3 nm. Thus the etalons 25 and 26 need not be very small in thickness but may be of a practical thickness.

The transmittance of the light of 810 nm at the etalons 25 and 26 is as high as 99% since only resonant wavelengths can pass through the etalons 25 and 26, and accordingly loss is very small, whereby the threshold current can be reduced, the light emission efficiency can be improved and a high output light beam 11F can be obtained.

Figure 8:
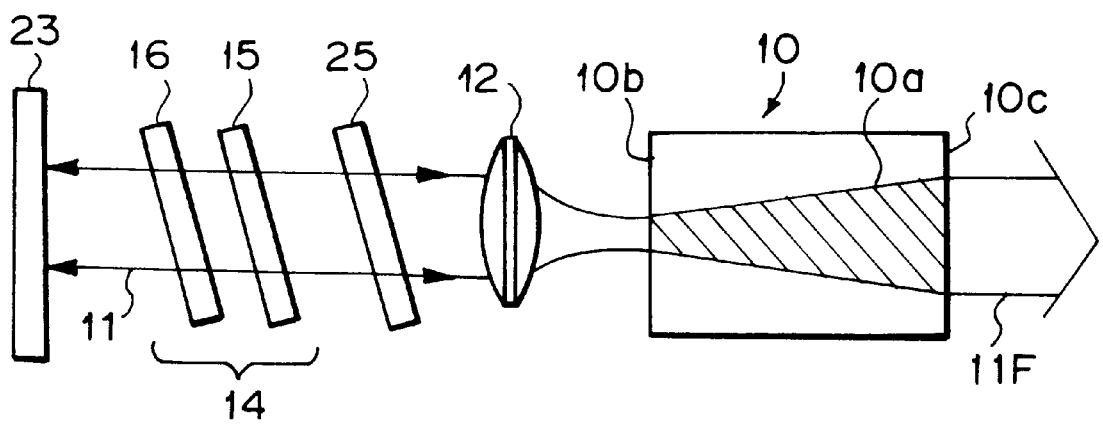
FIG. 8 is a schematic plan view of a semiconductor light emission device in accordance with a third embodiment of the present invention.

A semiconductor light emission device in accordance with a third embodiment of the present invention will be described with reference to FIG. 8, hereinbelow. The semiconductor light emission device of the third embodiment differs from that of the second embodiment in that a Lyot filter 14 is employed in place of the etalon 26.

By combining the etalon 25 and the Lyot filter 14, more sharper wavelength selection can be obtained. Since the etalon 25 and Lyot filter 14 are inherently high in transmittance, loss can be suppressed low even if the etalon 25 and the Lyot filter 14 are combined. So long as the transmittance does not become too low, the number of the etalons and/or the Lyot filters may be increased in order to further sharpen the wavelength selection.

Figure 9:
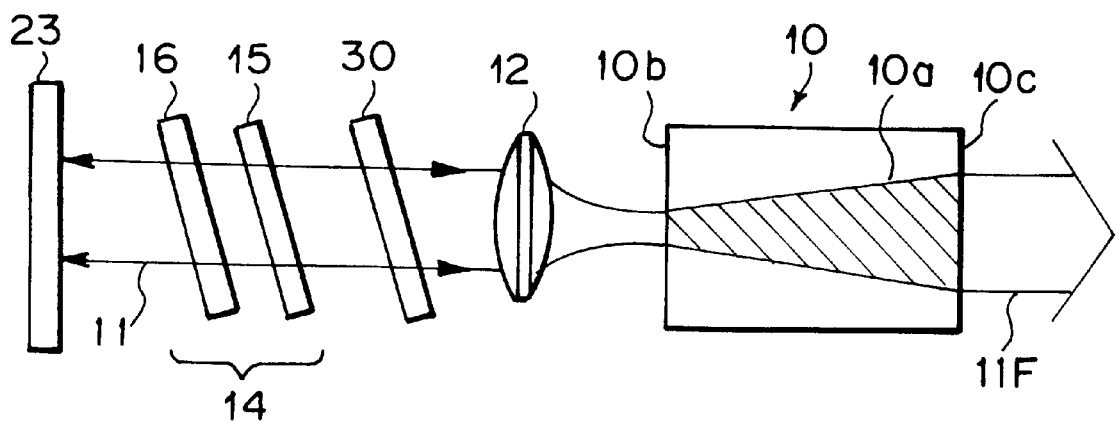
FIG. 9 is a schematic plan view of a semiconductor light emission device in accordance with a fourth embodiment of the present invention.

A semiconductor light emission device in accordance with a fourth embodiment of the present invention will be described with reference to FIG. 9, hereinbelow. The semiconductor light emission device of the fourth embodiment differs from that of the third embodiment in that a band pass filter 30 which is narrow in the transmission wavelength band is employed in place of the etalon 25. The peak transmission wavelength of the band pass filter 30 is matched with that of the Lyot filter 14.

Figure 10A:
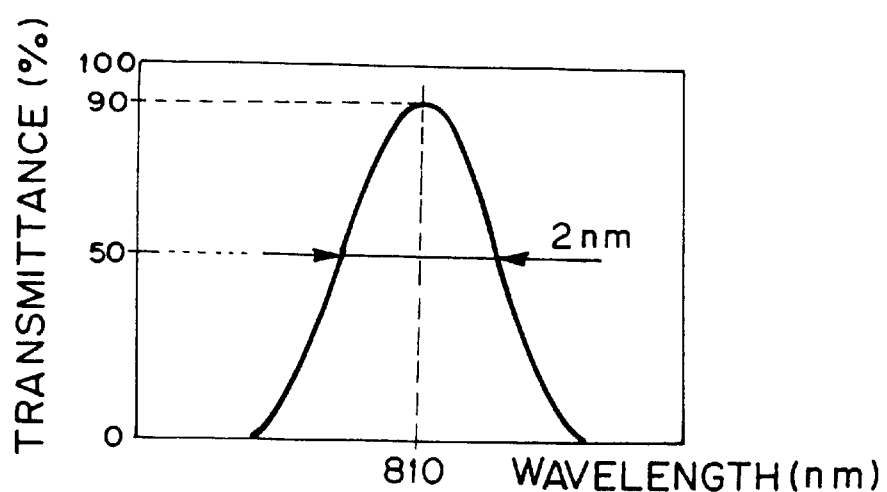
FIG. 10A is a graph showing the transmission spectrum of the band pass filter employed in the fourth embodiment.
Figure 10B:
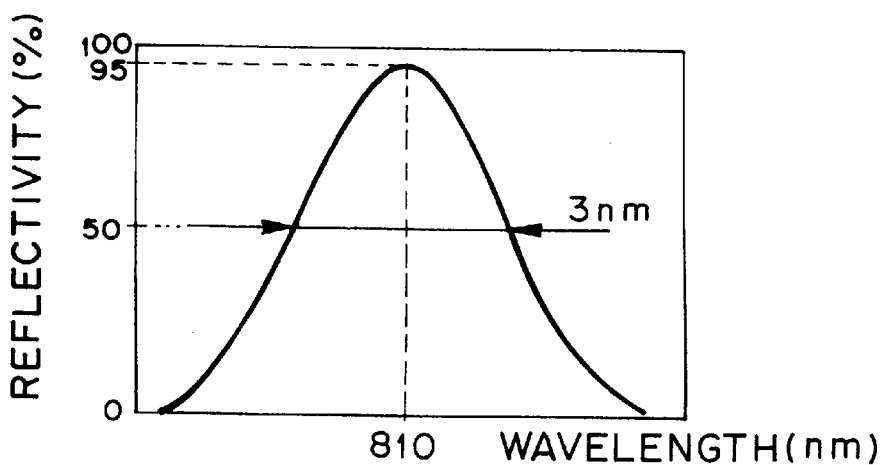
FIG. 10B is a graph showing the reflection spectrum of the dielectric multilayer mirror employed in the fourth embodiment.
Figure 10C:
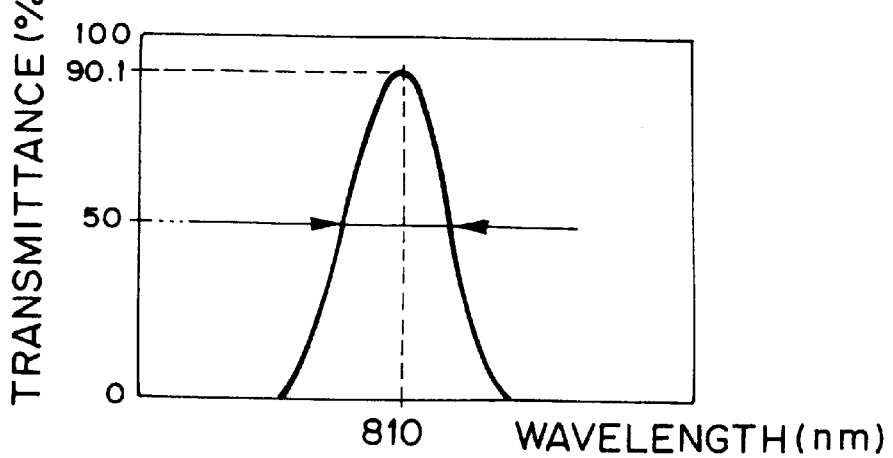
FIG. 10C is a graph showing the combined transmission spectrum of the band pass filter and the Lyot filter employed in the fourth embodiment.
Figure 11:
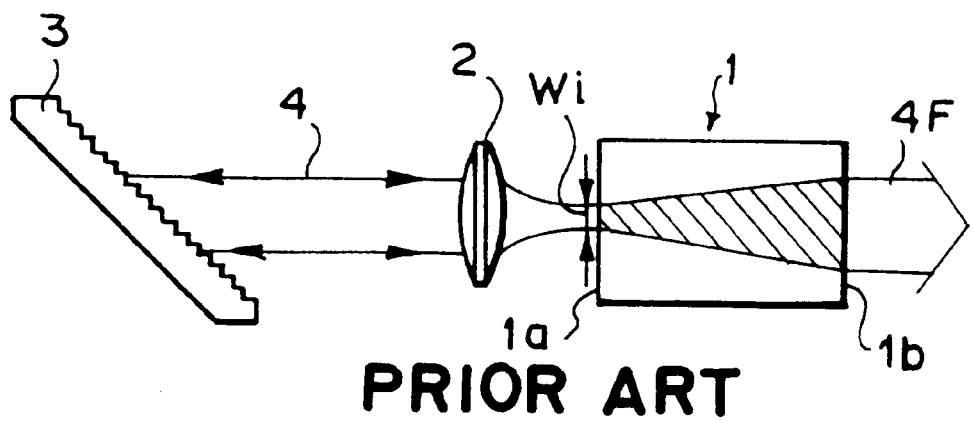
FIG. 11 is a schematic plan view of a conventional semiconductor light emission device.
Figure 12:
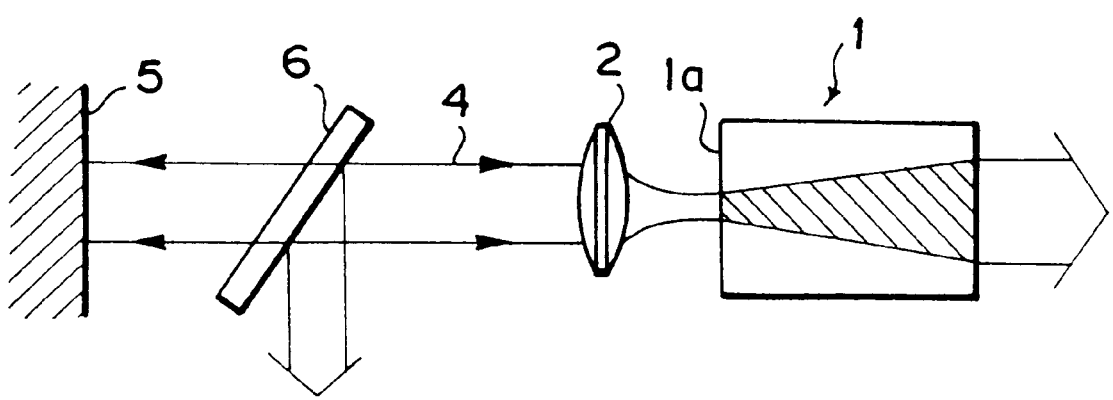
FIG. 12 is a schematic plan view of another conventional semiconductor light emission device.

In this embodiment, since the oscillation mode is made a single longitudinal mode by the use of not only the band pass filter 30 but also the Lyot filter 14, the band pass filter 30 may be relatively gentle in wavelength selection properties and may be relatively high in transmittance. The transmission spectrum of the band pass filter 30, the dielectric multilayer mirror 23 and the combined transmission spectrum of the band pass filter 30 and the Lyot filter 14 are shown in FIGS. 10A to 10C, respectively. As can be understood from FIGS. 10A to 10C, the combined transmission spectrum is sharper than that of the band pass filter 30 by itself. Accordingly, also in this embodiment, loss can be smaller than the conventional semiconductor light emission device where only a band pass filter is employed as a wavelength selector.

Though, in the embodiments described above, an AlGaAs semiconductor light amplifier 10 is employed, other semiconductor light amplifiers such as InGaAsP semiconductor light amplifiers, InGaN semiconductor light amplifiers and the like may be used. Especially when an InGaN semiconductor light amplifier is employed, a light beam having a wavelength in an ultraviolet region to a blue region can be obtained at an output power of a watt order.

What is claimed is:

1. A semiconductor light emission device comprising:
   a semiconductor light amplifier having a rear end face and a front end face;
   a mirror which reflects light emanating from said rear end face of said semiconductor light amplifier to return to said rear end face of said semiconductor light amplifier; and
   a wavelength selector which is inserted into the optical path of the light between said mirror and said rear end face of said semiconductor light amplifier, wherein said wavelength selector comprises a Lyot filter,
   wherein said light returned to said rear end face of said semiconductor light amplifier is amplified in said semiconductor light amplifier before being output from said front end face of said semiconductor light amplifier.

2. A semiconductor light emission device as defined in claim 1 in which said mirror is a dielectric multilayer mirror which is narrow in the reflection wavelength band.

3. A semiconductor light emission device as defined in claim 1 wherein said semiconductor light amplifier further comprises a tapered stripe having a narrow end at said rear end face of said semiconductor light amplifier and a wide end at said front end face of said semiconductor light amplifier.

4. A semiconductor light emission device as defined in claim 1 wherein said rear end face and said front end face are provided with a low reflectivity coating, wherein reflectivity as seen from inside said semiconductor light amplifier is not higher than 0.5%.

5. A semiconductor light emission device comprising:
   a semiconductor light amplifier having a rear end face and a front end face;
   a mirror which reflects light emanating from said rear end face of said semiconductor light amplifier to return to said rear end face of said semiconductor light amplifier; and
   a wavelength selector which is inserted into the optical path of the light between said mirror and said rear end face of said semiconductor light amplifier, wherein said wavelength selector comprises an etalon,
   wherein said light returned to said rear end face of said semiconductor light amplifier is amplified in said semiconductor light amplifier before being output from said front end face of said semiconductor light amplifier.

6. A semiconductor light emission device as defined in claim 5 in which said mirror is a dielectric multilayer mirror which is narrow in the reflection wavelength band.

7. A semiconductor light emission device as defined in claim 5 wherein said semiconductor light amplifier further comprises a tapered stripe having a narrow end at said rear end face of said semiconductor light amplifier and a wide end at said front end face of said semiconductor light amplifier.

8. A semiconductor light emission device as defined in claim 5 wherein said rear end face and said front end face are provided with a low reflectivity coating, wherein reflectivity as seen from inside said semiconductor light amplifier is not higher than 0.5%.

9. A semiconductor light emission device comprising:
   a semiconductor light amplifier having a rear end face and a front end face;

a mirror which reflects light emanating from said rear end face of said semiconductor light amplifier to return to said rear end face of said semiconductor light amplifier; and a wavelength selector which is inserted into the optical path of the light between said mirror and said rear end face of said semiconductor light amplifier, wherein said wavelength selector comprises a Lyot filter and an etalon, wherein said light returned to said rear end face of said semiconductor light amplifier is amplified in said semiconductor light amplifier before being output from said front end face of said semiconductor light amplifier.

10. A semiconductor light emission device as defined in claim 9 in which said mirror is a dielectric multilayer mirror which is narrow in the reflection wavelength band.

11. A semiconductor light emission device as defined in claim 9 wherein said semiconductor light amplifier further comprises a tapered stripe having a narrow end at said rear end face of said semiconductor light amplifier and a wide end at said front end face of said semiconductor light amplifier.

12. A semiconductor light emission device as defined in claim 9 wherein said rear end face and said front end face are provided with a low reflectivity coating, wherein reflectivity as seen from inside said semiconductor light amplifier is not higher than 0.5%.

13. A semiconductor light emission device comprising:

a semiconductor light amplifier having a rear end face and a front end face;

a mirror which reflects light emanating from said rear end face of said semiconductor light amplifier to return to said rear end face of said semiconductor light amplifier; and a wavelength selector which is inserted into the optical path of the light between said mirror and said rear end face of said semiconductor light amplifier, wherein said wavelength selector comprises a band pass filter and a Lyot filter;

wherein said band pass filter has a narrow transmission wavelength band, and a first peak transmission wavelength which matches a second peak transmission wavelength of said Lyot filter.

14. A semiconductor light emission device as defined in claim 13 in which said mirror is a dielectric multilayer mirror which is narrow in the reflection wavelength band.

15. A semiconductor light emission device as defined in claim 13 wherein said semiconductor light amplifier further comprises a tapered stripe having a narrow end at said rear end face of said semiconductor light amplifier and a wide end at said front end face of said semiconductor light amplifier.

16. A semiconductor light emission device as defined in claim 13 wherein said rear end face and said front end face are provided with a low reflectivity coating, wherein reflectivity as seen from inside said semiconductor light amplifier is not higher than 0.5%.

* * * * *